United States Patent [19]
Ichimaru

[11] Patent Number: 5,661,426
[45] Date of Patent: Aug. 26, 1997

[54] LOGIC CIRCUIT

[75] Inventor: Kouzou Ichimaru, Kunisaki-machi, Japan

[73] Assignee: Texas Instruments Incorporated, Dallas, Tex.

[21] Appl. No.: 589,130

[22] Filed: Jan. 22, 1996

Related U.S. Application Data

[63] Continuation of Ser. No. 228,980, Apr. 18, 1994, abandoned.

[30] Foreign Application Priority Data

Apr. 16, 1993 [JP] Japan .................................. 5-089888

[51] Int. Cl.⁶ .................................................. H03K 3/289
[52] U.S. Cl. .......................... 327/203; 327/202; 327/53; 327/404
[58] Field of Search .................. 307/272.2, 291, 307/608, 455, 289; 327/52, 53, 57, 202, 199, 203, 404

[56] References Cited

U.S. PATENT DOCUMENTS 4,777,388  10/1988  Widener ........................... 307/272.2
5,049,760   9/1991  Ooms .............................. 307/272.2

FOREIGN PATENT DOCUMENTS 0292910  12/1990  Japan.

*Primary Examiner*—Timothy P. Callahan
*Assistant Examiner*—Jung Ho Kim
*Attorney, Agent, or Firm*—Rich Donaldson; William Kempler

[57] ABSTRACT

A logic circuit for implementing a flip-flop circuit that operates stably and at high speed at a low supply voltage of about 1 V. The logic circuit includes transistors 25,26,31 for forming a first current mirror circuit 2; transistors 27,28 for converting clock signals to current signals; transistors 19,22, 23 for forming a second current mirror circuit 3; and transistors 20,21,24 forming a third current mirror circuit 4. These current mirror circuits supply a current nearly equal to the current from transistors 27,28 to the circuits connected respectively to those current mirror circuits. Transistors 29,30, current source 47, voltage source 50 and voltage comparison circuit 51 form a voltage maintenance circuit. Transistors 11,12 and resistors 41,42 form an input stage of a master D flip-flop D-FF, and transistors 13,14 form the signal-holding row of the master D flip-flop D-FF. Transistors 15,16 and resistors 43,44 form an input stage of a slave D flip-flop D-FF, and transistors 17,18 form a signal-holding stage of the slave D flip-flop D-FF.

5 Claims, 3 Drawing Sheets

LOGIC CIRCUIT

This application is a continuation of application Ser. No. 08/228,980, filed Apr. 18, 1994, now abandoned.

The present invention relates to a logic circuit for implementing a flip-flop circuit that operates stably at a low supply voltage and is capable of operating at high speed.

BACKGROUND OF THE INVENTION

Conventionally, a flip-flop circuit of a semiconductor integrated circuit that operates at high speeds, i.e., clock frequencies of 100 MHz or above, has been constructed as described below.

FIG. 6 is a diagram showing the circuit of a conventional ECL master-slave type flip-flop circuit 7.

In FIG. 6, the flip-flop circuit 7 comprises npn transistors Q'1–Q'19, 71–89, resistors R'1–R'4, 91–94 and a power source 95.

The transistors 71–74,79,80 form a master D flip-flop (D-FF).

The transistors 75–78,81,82 form a slave D flip-flop D-FF.

Of these transistors, the transistors 79–82 function as the current switches for switching the current paths of respectively corresponding transistors which respond to the clock signals according to their logic values.

The transistors 83–86,89 form the constant current sources of respective master D flip-flops D-FFs.

In FIG. 6, each symbol attached to each terminal indicates the names of that terminal and signal, with a horizontal overbar indicating the logical negation (reversal) of a signal.

The operation of the master D flip-flop D-FF is as described below.

When a logic value 0 (voltage value L) is input to a non-inverting clock input terminal (CK) while a logic value 1 (voltage value H) is input to an inverting clock input terminal, transistor enters a nonconducting state (turns off), and transistor 87 enters a conductive state (turns on). In the wake of the above, transistor 80 turns off, and the transistor 79 turns on. In the case, when the non-inverting input terminal D has a logic value of 1 and the inverting input terminal has a logic value of 0, transistor 71 turns on, and transistor 72 turns off.

Accordingly, in FIG. 6, a attains a logic value of 0, and b attains a logic value of 1.

In this case, when the transistor 80 is off, current is not supplied to the transistors 73,74.

In this state, when the non-inverting clock input terminal attains a logic value of 1 and the inverting clock input terminal attains a logic value of 0, the transistor 87 turns off, transistor 88 turns on, transistor 79 turns off, and the transistor 80 turns on.

Therefore, transistors 71,72 enter the state of not having a current supply while transistors 73,74 enter the state of having a current supply.

In this case, because, as mentioned above, a shown in FIG. 6 has a logic value of 0 while b therein has a logic value of 1, transistor 74 turns off, and the transistor 73 turns on.

Consequently, a, to which the collector of transistor 73 is connected, retains a logic value of 0, and b, to which the collector of transistor 74 is connected, retains a logic value of 1.

As has been mentioned above, in a and b in FIG. 6, the values of the inverted input terminal and non-inverting input terminal are saved immediately before the non-inverting clock input terminal attains a logic value of 1 and the inverting clock input terminal attains a logic value of 0 are maintained, respectively.

This operation is common to the slave D flip-flops D-FFs.

The flip-flop circuit 7 is constructed to connect the master D flip-flop D-FF and slave D flip-flop D-FF by ECL circuit as mentioned above in series, in a manner that the clock signals input to them are equivalently logically inverted. In this way, it forms the master-slave flip-flop D-FF.

The flip-flop circuit 7 mentioned above is, from the standpoint of the method for the configuration of a master-slave D-flip-flop, quite a general circuit.

However, for the uses at clock frequencies of 100 MHz or above to which the flip-flop circuit is applied, general CMOS logic circuits cannot be employed.

The reason for this is that when a general CMOS circuit is used, too much power is consumed.

In the master-slave D-flip-flop constituted by the ECL circuit described in the prior art, because two transistors are connected in series between the power source and ground, a supply voltage of at least twice that between the base and emitter of a transistor is required. In other words, at least about 1.2 V is necessary for the supply voltage. In addition, there is the problem that 1.8 V or more must be supplied to enable the master-slave D flip-flop to perform in a stable manner in actual operation.

To operate logic circuits, such as flip-flops, stably at low voltage is important, for example, in the field of small size mobile transmitters.

For reducing the size of mobile transmitters, it is indispensable to reduce the size of the battery to be used.

Batteries normally used for mobile transmitters are auxiliary batteries, such as nickel-cadmium batteries, and the starting power of a single unit is usually at the level of 1 V.

For the circuits as shown in the prior art, the development has proceeded with size reduction as one of the most preferential objects, but this is not applicable to a device using a general auxiliary battery in a single unit as the power source.

It is an object of the present invention to provide a logic circuit for implementing flip-flops, etc., that is capable of operating stably and at high speed at a low supply voltage of about 1 V.

SUMMARY OF THE INVENTION

The logic circuit according to the present invention comprises a clock signal converting means that includes a differential circuit comprising first and second transistors whose control terminals receive the clock signal or its inverted signal, with the design that, in response to the logic values of the clock signal and the inverted signal, the first or second transistor forms a first or second current path between the power source and ground; a first latching means that includes a differential circuit comprising third and fourth transistors whose control terminals respectively receive two logic signals with opposite logic values, with the design that, when the current is supplied in accordance with the logic values of the two logic signals, either the third or fourth transistor mentioned above becomes conductive and retains the logic values of the two logic signals; a second latching means that includes a differential circuit comprising fifth and sixth transistors whose control terminals respectively receive two logic signals having opposite logic values which are output from the first latching means, with the design that, when the current is supplied, either the fifth or sixth transistor mentioned above becomes conductive in response to the logic values of the two logic signals and retains the logic values of the two logic signals; a first current mirror circuit that includes seventh and eighth transistors whose control terminals are connected to the current input terminal of the first transistor, with the design that, when the first current path is formed, it supplies the mirrored current to the first latching means; and a second current mirror circuit that includes ninth and tenth transistors whose control terminals are connected to the current input terminal of the second transistor, with the design that, when the second current path is formed, it supplies the mirrored current to the second latching means.

Furthermore, the logic circuit provided by the present invention includes a voltage maintenance means for maintaining the voltages applied between the serially connected first latching means and first current mirror circuit and between the second latching means and the second current mirror circuit, respectively, at the specified values.

In the logic circuit of the present invention, by making respective logic values of the input clock signal and inverted clock signal correspond to the presence or absence of the current having the specified value, respective current signals showing the logic values are supplied, as mirrored currents with approximately the same values as the current signals, to the latching means of the ECL circuit by using the current mirror circuits. In this manner, a general ECL logic circuit is implemented by the combination of the current switch with the current mirror circuit.

In the logic circuit of the present invention, by setting the base-emitter junction [voltage] of the transistor between the power source and ground to be equal to 1, it is possible for the logic circuit to operate stably at the low voltage level that is obtained by adding the value of the voltage that enables the operation without causing the saturation of one transistor to the value of the voltage between the base and emitter of the transistor.

Also, by further providing a voltage maintenance means and thus maintaining the specified voltage in the serially connected latching means and current mirror circuit regardless of the logic level of the clock signal, etc., the present invention makes it possible to operate the circuit stably over a wide range of supply voltages.

Figure 1:
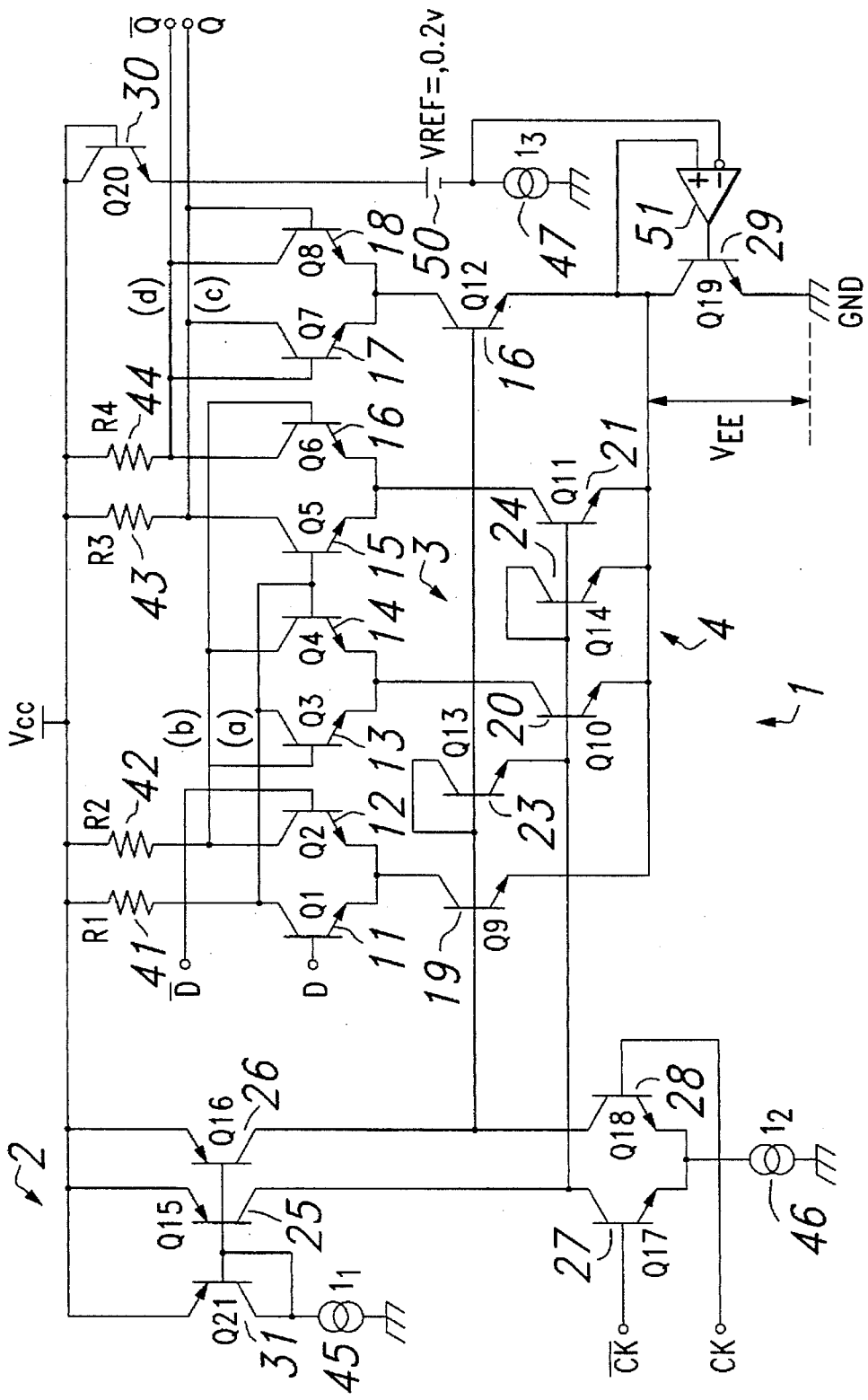
FIG. 1 is a circuit diagram of a flip-flop circuit according to the present invention.

Reference numerals as employed in the drawings:
1 . . . Flip-flop circuit
2, 3, 4, 6 . . . Current mirror circuit
11–33 . . . Transistor
41–44 . . . Resistor
45–47 . . . Current source
50 . . . Voltage source
51 . . . Voltage comparison circuit
5 . . . Toggle counter

DESCRIPTION OF PREFERRED EMBODIMENTS

FIG. 1 is a circuit diagram of a flip-flop circuit 1 in accordance with the invention.

The flip-flop circuit 1 is, for example, a master-slave D-flip-flop integrally formed on a semiconductor substrate by an ECL circuit, and comprising transistors Q1–Q21, 11–31, resistors 41–44, current sources 45–47, a voltage source 50, and a voltage comparison circuit 51.

Each symbol shown at the terminals in FIG. 1 indicates the name of a signal, and those with horizontal overbars indicate logical negations (reversals) of signals.

The transistors Q15,Q16,Q21, 25,26,31 form a first current mirror circuit 2, and they supply a current of almost the same value as that of the current source 45 to the transistors 27,28.

The transistors Q17,Q18, 27,28 control the supply of the current to each circuit from the first current mirror circuit 2 based on the respectively input non-inverted clock signal CK and inverted clock signal.

The current source 46 supplies the current to the transistors 27,28.

In other words, when the logic value of the non-inverted clock signal is 1 and the logic value of the inverted clock signal is 0, the transistor 28 becomes conductive (on), and the current is not supplied to each circuit connected to this transistor. In the other case, the transistor 27 becomes nonconductive (off), and the current is supplied to each circuit connected to it.

When the logic value of the non-inverted clock signal is 0 and the logic value of the inverted clock signal is 1, the reverse of the above takes place.

The flip-flop circuit 1 is constructed in a form in which the non-inverted clock signal and inverted clock signal are input from outside, but it may be constructed to provide the clock-inverting circuit in the flip-flop circuit 1, thereby inverting the clock signal within the flip-flop circuit 1.

The transistors Q9,Q12,Q13, 19,22,23, form a second current mirror circuit 3, and supply the current equal to the current running to transistor 28 to circuits respectively connected to transistors 19,23.

That is, to the transistors Q1,Q2, 11,12 and transistors Q7,Q8, 17,18 respectively connected to the transistors 19,22, the current is supplied only when the logic value of the non-inverted clock signal is 0.

The transistors Q10,Q11,Q14, 20,21,24 comprise a third current mirror circuit 4, and supply the current equal to the current running to transistor 27 to respective circuits connected to the transistors 20,21.

This means that current is supplied to transistors Q3,Q4, 13,14 and transistors Q5,Q6, 15,16 respectively connected to the transistors 20,21 only when the logic value of the inverted clock signal is 0.

Figure 2:
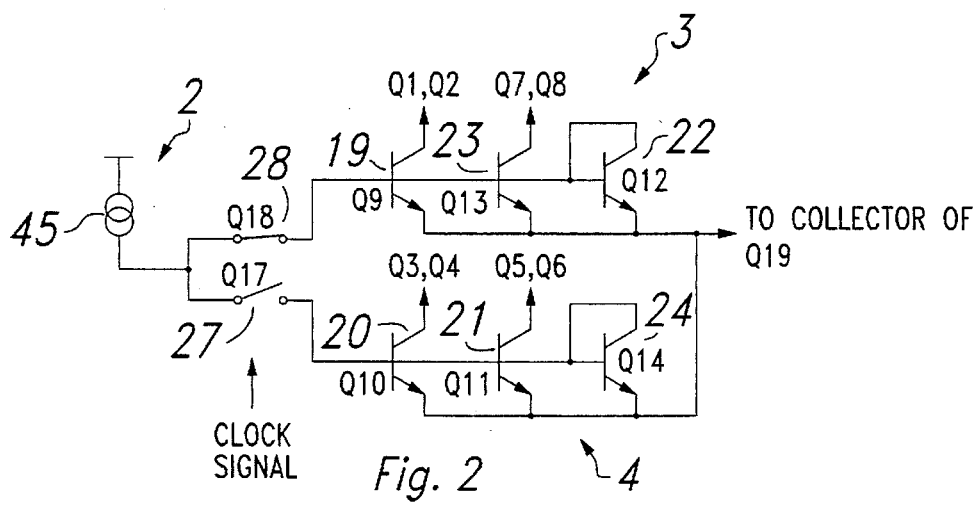
FIG. 2 is a schematic diagram showing the connections of a first current mirror circuit, a second current mirror circuit, and a third current mirror circuit included in the flip-flop circuit of FIG. 1.

FIG. 2 is a diagram showing the connections between the first current mirror circuit, the second current mirror circuit, and the third current mirror circuit.

The current output of the first current mirror circuit 2 is provided by transistors 25,26,31, and current source 45 is controlled by transistors 27,28 based on the clock signals, and output to the second current mirror circuit 3 and third current mirror circuit 4.

From the second current mirror circuit 3, power is supplied to transistors 11,12,17,18.

From the third current mirror circuit 4, power is supplied to transistors 13,14,15,16.

The transistors 29,30, the current source 47, the voltage source 50 and the voltage comparison circuit 51 form a voltage maintenance circuit.

In this voltage maintenance circuit, to the reverse input of the voltage comparison circuit 51, the value obtained by adding the voltage of the voltage source 50 to the voltage between the base and emitter of the transistor 30 is applied, and the voltage comparison circuit 51 compares the collector voltage of the transistor 29 with this voltage.

The voltage comparison circuit 51 controls the collector voltage of the transistor 29, which is to be lowered, by controlling the transistor 29 when the collector voltage of the transistor 29 is higher than the voltage applied to its reverse input, while, in the opposite case, controls the collector voltage that is to be increased.

By the operation as mentioned above, the voltage Vee between ground and the collector of the transistor 29 is controlled, and the voltage between the supply voltage Vcc and the collector of the transistor 29 is set at the value (about 0.8–0.9 V) that is obtained by adding the voltage (about 0.2 V) of the voltage source 50 to the voltage (about 0.6 V) between the base and emitter of one transistor.

Therefore, the voltage between the collector and emitter of the transistors 27,28 is secured; thus, regardless of the logic level of the clock signal, the transistors 27,28, etc., operate stably.

The current source 47 supplies the current running to the transistor 30 and the voltage source 50.

The transistors 11,12 and the resistors 41,42 form the input stage of the master D-flip-flop (D-FF).

The transistors 13,14 form the signal-holding stage of the master D flip-flop D-FF.

The transistors 15,16 and the resistors 43,44 form the input stage of the slave D-flip-flop D-FF.

The transistors 17,18 form the signal-holding stage of the slave D-flip-flop D-FF.

In this case, to the input stage of the master D-flip-flop D-FF, the transistor 19 is connected while, to the signal-holding stage of the slave D flip-flop D-FF, the transistor 22 is connected, and the bases of the transistors 19,22 are connected together.

Also, the transistor 20 is connected to the signal-holding stage of the master D flip-flop D-FF, while the transistor 21 is connected to the input stage of the slave D flip-flop D-FF, and the bases of the transistors 20,21 are connected together.

Accordingly, the clock signals input to the master D flip-flop D-FF and slave D flip-flop D-FF are equivalently inverted.

Figure 3:
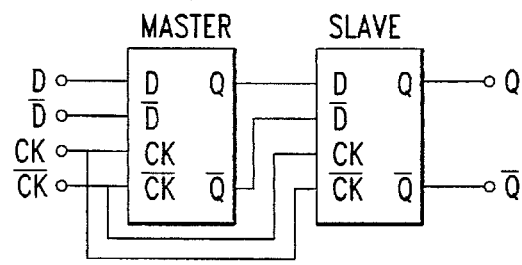
FIG. 3 is a diagram showing the relationship between the master D flip-flop D-FF and slave D flip-flop D-FF, by means of logic blocks.

When the relationship between the master D flip-flop D-FF and the slave D flip-flop D-FF of this flip-flop circuit 1 is expressed by the logic symbols, they become as shown in FIG. 3.

FIG. 3 is a diagram showing the relationship between the master D flip-flop D-FF and slave D flip-flop D-FF by logic blocks.

That is, the circuit of the flip-flop circuit 1 is, when viewed from its logic, equivalent to the case where the non-inverting output signal Q and inverted output signal of the master D flip-flop D-FF are respectively input to the non-inverting input terminal D and reverse input terminal of the slave D flip-flop D-FF, and on the other hand, the non-inverted clock signal CK is input to the non-inverting clock input terminal of the master D flip-flop D-FF and the inverting clock input terminal of the slave D flip-flop D-FF, while the inverted clock signal is input to the inverting clock input terminal of the master D flip-flop D-FF and the non-inverting clock input terminal of the slave D flip-flop D-FF.

When the logic value 0 (voltage value L≈Vee) is input to the non-inverting clock input terminal. CK of the flip-flop circuit 1 while the logic value 1 (voltage value H≈Vcc) is input to the inverting clock input terminal thereof, the transistor 28 turns off and the transistor 27 turns on.

In this case, the first current mirror circuit 2 formed of the transistors 25,26, etc. is connected to the transistors 27,28 and the transistor 27, which is on, supplies the current from the current mirror circuit 2 to the current source 46, and the transistor 28, which is off, supplies the current from the current mirror circuit 2 to the second current mirror circuit 3 comprising the transistors 19,22,23.

Thus, current nearly equal to the current supplied to the transistor 23 from the foregoing current mirror circuit 2 is supplied to the transistors 19,22.

At this time, as power is not supplied to the third current mirror circuit 4, current is not supplied to the transistors 13,14 via the transistor 20, and also, the current is not supplied to the transistors 15,16 via the transistor 21.

Accordingly, the logic values of a, b in FIG. 1 are not affected by the transistors 13,14.

In this case, when the logic value of the non-inverting input terminal D is 1 and the logic value of the inverting input terminal $\overline{D}$ is 0, the transistor 11 turns on, and the transistor 12 turns off.

As a result, in FIG. 1, a attains a logic value of 0 while b attains a logic value of 1.

In this state, when the non-inverting clock input terminal attains a logic value of 0 and the inverting clock input terminal attains a logic value of 1, transistor 28 turns off and transistor 27 turns on.

Therefore, the state becomes the reverse of that mentioned above, and current is not supplied to transistors 11,12, while current is supplied to the transistors 13,14.

Here, because, as mentioned above, a shown in FIG. 1 has a logic value of 0 while b has a logic value of 1, transistor 14 turns off and transistor 13 turns on.

Accordingly, a, to which the collector of transistor 13 is connected, maintains a logic value of 0, and b, to which the collector of transistor 14 is connected, maintains a logic value of 1.

As has been described above, in a,b in FIG. 1, the values that the reverse input terminal and non-inverting input terminal had immediately before the logic value of the non-inverting clock input terminal became 1 and the inverting clock input terminal became 0 are respectively saved.

In this case, as the current is supplied to the third current mirror circuit 4, the transistor 16 turns on, and the transistor 15 turns off.

Consequently, the logic values of the non-inverting output terminal Q and inverting output terminal $\overline{Q}$ become 1 and 0, respectively.

Also, as the current is not supplied from the second current mirror circuit 3 to the transistors 17,18, the non-inverting output terminal Q and inverting output terminal $\overline{Q}$ are not affected by those transistors. As a result, the logic values of a,b shown in FIG. 1 are output to the non-inverting output terminal Q and inverting output terminal $\overline{Q}$ after being inverted.

Furthermore, when the non-inverted clock signal attains a logic value of 1 and the inverted clock signal attains a logic value of 0, transistors 17,18 hold the values of the non-inverting output terminal Q and inverting output terminal $\overline{Q}$, as in the case described for the transistors 13,14.

In this state, since current is not supplied to transistors 13–16 and these transistors do not operate, the logic values of the non-inverting input terminal D and reverse input terminal $\overline{D}$ do not affect the non-inverting output terminal Q.

By the operation described above, the flip-flop circuit 1 retains the signals input respectively to the non-inverting input terminal D and reverse input terminal $\overline{D}$, at the first rise point of the clock signal, and outputs them to the non-inverting output terminal Q and inverting output terminal $\overline{Q}$, respectively.

Hereafter, the operations of the flip-flop circuit 1 are summarized in a manner to facilitate understanding.

When the non-inverted clock signal has a logic value of 0 while the inverted clock signal has a logic value of 1, the input stage of the master D flip-flop D-FF outputs the logic value opposite the logic value of the non-inverting input terminal to a, and outputs the logic value opposite the logic value of the reverse input terminal to b.

To the signal-holding stage of the master D flip-flop D-FF, current is not supplied, and it does not operate.

Current is not supplied to the input row of the slave D flip-flop D-FF and it does not operate.

The signal-holding stage of the slave D flip-flop D-FF maintains the previous state.

When the non-inverted clock signal has a logic value of 1 and the inverted clock signal has a logic value of 0, the input stage of the master D flip-flop D-FF is not supplied with current, and it does not operate.

The signal-holding stage of the master D flip-flop D-FF maintains the logic values of a and b.

The input stage of the slave D flip-flop D-FF outputs the logic value opposite A to the non-inverting output Q, and outputs the logic value opposite b to the inverting output $\overline{Q}$.

The signal-holding stage of the slave D flip-flop D-FF is not supplied with current, and it does not operate (the logic values of the non-inverting output Q and inverting output $\overline{Q}$ are not affected by it).

In the first embodiment, the flip-flop circuit 1 is constructed with the design to capture the input signal after together with the non-inverting input signal being inverted externally, but it may be constructed to invert the input signal within the flip-flop circuit 1.

Also, flip-flop circuit 1 is not necessarily formed integrally on a substrate, and it may be implemented by using discrete parts.

Furthermore, the present invention is applicable not only to flip-flop circuits, but also to other logic circuits. In this case, the signal for converting to the current signal is not limited to the clock signal.

A second embodiment of the invention will now be described.

Figure 4:
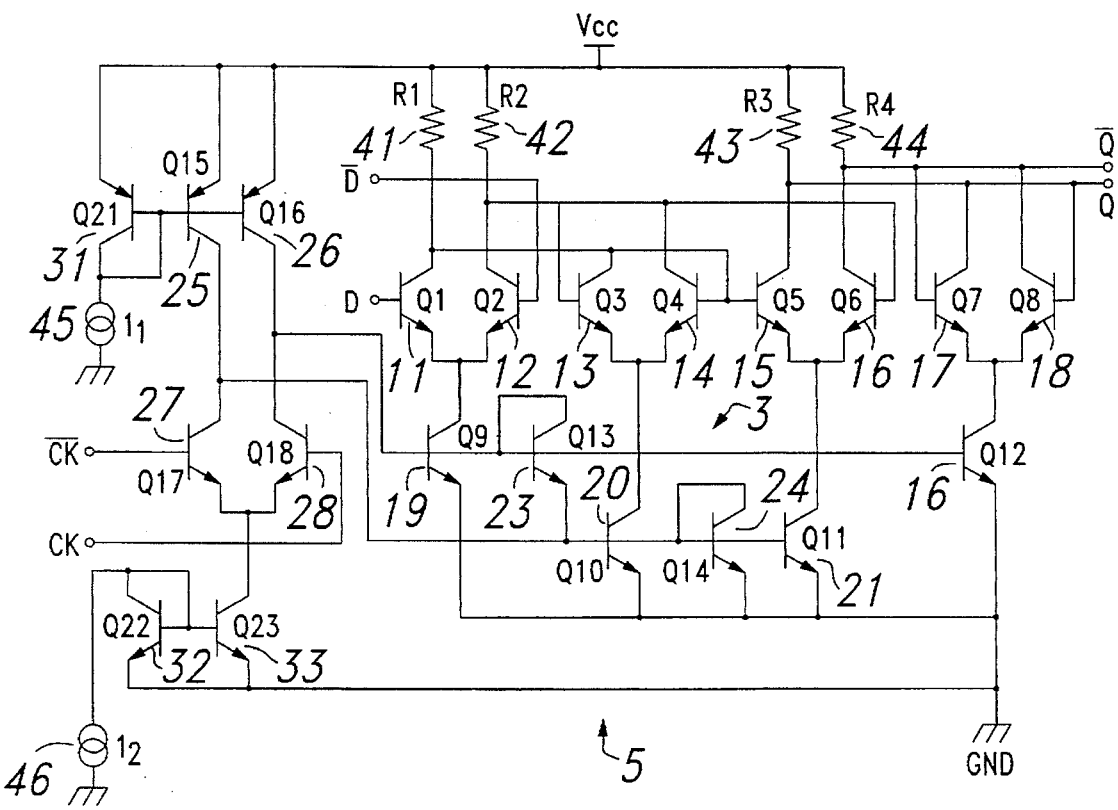
FIG. 4 is a circuit diagram of a toggle counter circuit using the flip-flop circuit according to the present invention.

FIG. 4 is a circuit diagram of a toggle counter 5 that uses the flip-flop circuit according to the present invention.

The toggle counter 5 is a circuit for dividing (into halves) the clock signal at the level suitable for the case when the collector voltage of the transistor 29 in the flip-flop circuit 1 is set as the ground potential.

Therefore, the transistors 29,30, the current source 47, the voltage source 50 and the voltage comparison circuit 51 in the flip-flop circuit 1 are omitted.

Also, it has the fourth current mirror circuit 6 comprising transistors 32,33 and current source 46.

Besides, in order to make the toggle counter from the flip-flop circuit obtained by modifying the flip-flop circuit 1 as described above, connection is made between the non-inverting output terminal Q and reverse input terminal $\overline{D}$, and between the inverting output terminal $\overline{Q}$ and the non-inverting input terminal D.

A simulation was conducted for the toggle counter 5, under the conditions of 0.9 V supply voltage, and 100 MHz in clock frequency.

Figure 5A:
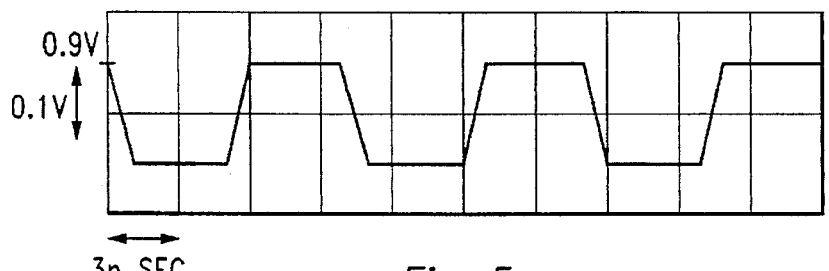
FIGS. 5(a) and 5(b) are charts showing the results of a simulation for the toggle counter.
Figure 5B:
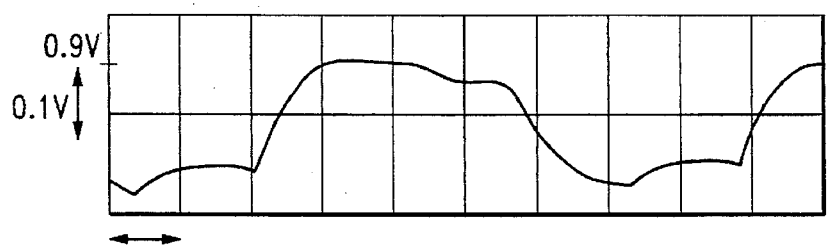
Figure 6:
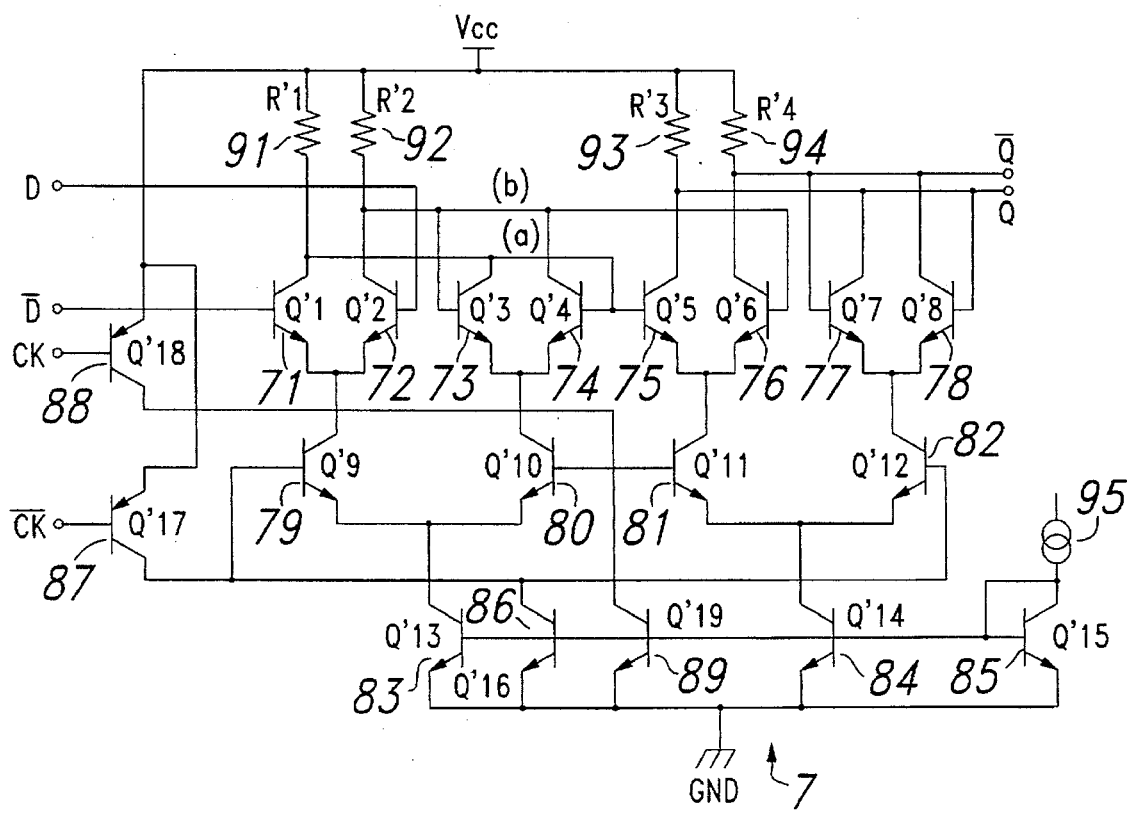
FIG. 6 is a circuit diagram of a conventional ECL master-slave type flip-flop circuit.

FIGS. 5(a) and 5(b) are graphs showing the results of the simulation for toggle counter 5.

In FIG. 5(a), the waveform shown is the waveform of the non-inverting clock input signal CK.

The waveform shown in 5(b) is the waveform of the non-inverting output signal Q of the toggle counter 5.

It was confirmed that, using toggle counter 5, at 0.9 V supply voltage, the division of the clock signal of 100 MHz into halves can be stably implemented.

In addition to the structures in the respective embodiments as described, the logic circuit of the present invention may take various other structures, such as the modification shown in the embodiments, and that with the circuit of the present invention incorporated as a part in a semiconductor integrated circuit.

As has been described, according to the present invention, it is possible to provide a logic circuit capable of stably handling a signal of 100 MHz or above at a low supply voltage.

By the use of the logic circuit of the present invention, for example, it becomes possible to manufacture a mobile communication device that operates at a supply voltage lower than that used conventionally. Also, as it is possible to reduce the size of the batteries used for the mobile communication device, the device itself can be reduced in size.

Furthermore, the logic circuit of the present invention operates stably regardless of the logic level of the signal to be input.

I claim:

1. A logic circuit for implementing a flip-flop circuit that operates in a stable manner, said logic circuit comprising:

clock signal converting means including a differential circuit comprising a first transistor having input and output terminals and a control gate for receiving a clock signal having either a first binary logic value or a second binary logic value alternating in a time sequence, and a second transistor having input and output terminals and a control gate for receiving an inverted clock signal having either the first binary logic value or the second binary logic value alternating in a time sequence, said first and second transistors being respectively responsive to the clock signal and the inverted clock signal for alternately providing a first current path through said first transistor or a second current path through said second transistor in dependence upon the clock signal being at one of the first and second binary logic values and the inverted clock signal being at the other of the first and second binary logic values when the first current path is provided through said first transistor and upon the clock signal being at the other of the first and second binary logic values and the inverted clock signal being at said one of the first and second binary logic values when the second current path is provided through said second transistor;

first latching means including a third transistor having a control gate for receiving a first logic signal of one binary logic value and a fourth transistor having a control gate for receiving a second logic signal of the other binary logic value, said third and fourth transistors defining a master flip-flop, wherein said current is supplied to the first latching means in dependence upon an occurrence of said first or second logic signal as applied to the control gate of the corresponding one of said third and fourth transistors, one of said third and fourth transistors becomes conductive and captures one of the binary logic values of said first and second logic signals;

second latching means including a fifth transistor having a control gate and a sixth transistor having a control gate, said fifth and sixth transistors being connected so as to define a slave flip-flop, wherein upon the application of said first and second logic signals of opposite binary logic values output from said first latching means to the control gates of said fifth and sixth transistors when current according to the opposite binary values of said first and second logic signals is supplied, to the second latching means one of said fifth and sixth transistors becomes conductive and captures one of the binary logic values of said first and second logic signals;

a first current mirror circuit connected to the current input terminal of said first transistor included in said clock signal converting means and supplying a mirrored current to said first latching means in response to the formation of said first current path through said first transistor; and a second current mirror circuit connected to the current input terminal of said second transistor included in said clock signal converting means and supplying a mirrored current to said second latching means in response to the formation of said second current path through said second transistor.

2. A logic circuit as set forth in claim 1, further including voltage maintenance means for securing the voltage across the input and output terminals of said first and second transistors included in said clock signal converting means.

3. A logic circuit as set forth in claim 2, further including a power line to which a voltage power source is adapted to be connected;

said first current mirror circuit including seventh and eighth transistors having respective input and output terminals with a control gate therebetween, the control gates of said seventh and eighth transistors being connected to the input terminal of said first transistor included in said clock signal converting means, said seventh and eighth transistors being rendered conductive when the first current path is connected through said first transistor between the voltage power source and ground and dependent upon the application of said clock signal to the control gate of said first transistor at a binary logic value rendering said first transistor conductive, said seventh and eighth transistors when conductive providing a mirrored current at the respective output terminals thereof to said first latching means.

4. A logic circuit as set forth in claim 3, wherein said second current mirror circuit includes ninth and tenth transistors having respective input and output terminals with a control gate therebetween;

the control gates of said ninth and tenth transistors being connected to the input terminal of said second transistor, said ninth and tenth transistors being rendered conductive when the second current path is connected through said second transistor between the voltage power source and ground and dependent upon the application of said inverted clock signal to the control gate of said second transistor at a binary logic value rendering said second transistor conductive, said ninth and tenth transistors when conductive providing a mirrored current at the respective output terminals thereof to said second latching means.

5. A logic circuit as set forth in claim 4, wherein said voltage maintenance means comprises eleventh and twelfth transistors having respective input and output terminals with a control gate interposed therebetween, a current source, a voltage source, and a voltage comparison circuit having inverted and non-inverted inputs and an output connected to the control gate of said twelfth transistor;

said eleventh transistor having its input terminal and control gate connected to said power line;

said voltage source of said voltage maintenance circuit being at its opposite sides between the output terminal of said eleventh transistor and said current source;

the side of said voltage source connected to said current source being also connected to the inverted input of said voltage comparison circuit;

the output terminals of said eighth transistor included in said first current mirror circuit and said tenth transistor included in said second current mirror circuit being connected together; and a node in the connection between the output terminals of said eighth transistor of said first current mirror circuit and said tenth transistor of said second current mirror circuit being connected to the non-inverted input of said voltage comparison circuit.

\* \* \* \* \*